(12) United States Patent
Scott et al.

(10) Patent No.: US 10,244,661 B2
(45) Date of Patent: Mar. 26, 2019

(54) AIRFLOW DUCTING APPARATUS FOR DATA PROCESSING SYSTEMS

(71) Applicant: III HOLDINGS 2, LLC, Wilmington, DE (US)

(72) Inventors: Walter Denton Scott, Austin, TX (US); Jeffrey Carl Defilippi, Austin, TX (US); David James Borland, Austin, TX (US); Stephan Leonidas Beatty, Dripping Springs, TX (US); Edward D. Geist, Austin, TX (US)

(73) Assignee: III Holdings 2, LLC, Wilmington, DE (US)

( * ) Notice: Subject to any disclaimer, the term of this patent is extended or adjusted under 35 U.S.C. 154(b) by 1053 days.

(21) Appl. No.: 14/054,815

(22) Filed: Oct. 15, 2013

(65) Prior Publication Data
US 2014/0177168 A1   Jun. 26, 2014

Related U.S. Application Data

(60) Provisional application No. 61/716,835, filed on Oct. 22, 2012.

(51) Int. Cl.
| G06F 1/16 | (2006.01) |
| H05K 5/00 | (2006.01) |
| H05K 7/00 | (2006.01) |
| H05K 7/20 | (2006.01) |

(52) U.S. Cl.
CPC ..... *H05K 7/20727* (2013.01); *H05K 7/20145* (2013.01)

(58) Field of Classification Search
CPC .. H05K 7/20145; H05K 7/20727; H05K 3/30; H05K 7/20736; H05K 7/20745; H05K 7/20754; H05K 7/20136; H05K 7/20718; G06F 1/20; G06F 1/185; G06F 1/203; G06F 1/206
USPC ... 361/678, 679.49, 679.51, 690–697, 679.5, 361/679.48, 679.54; 29/832
See application file for complete search history.

(56) References Cited

U.S. PATENT DOCUMENTS

| 5,544,012 | A  * | 8/1996  | Koike  | H05K 7/20572 165/122 |
| 6,400,568 | B1 * | 6/2002  | Kim    | G06F 1/20 165/104.33 |
| 6,504,718 | B2 * | 1/2003  | Wu     | H05K 7/20727 165/104.33 |
| 7,403,387 | B2 * | 7/2008  | Pav    | G06F 1/20 361/694 |
| 7,623,346 | B2 * | 11/2009 | Fujiya | H05K 7/20727 165/104.33 |

(Continued)

*Primary Examiner* — Anthony M Haughton
(74) *Attorney, Agent, or Firm* — Foley & Lardner LLP

(57) ABSTRACT

A data processing system includes an enclosure, one or more airflow manifold structures within the enclosure, and a plurality of data processor cards mounted within the enclosure. Each one of the one or more airflow manifold structures has an air inlet portion and an air outlet portion. Each one of the data processor cards extends substantially parallel to each other one of the data processor cards. Each one of the data processor cards includes an airflow duct having an air inlet portion thereof covering a portion of the air outlet portion of at least one of the one or more airflow manifold structures and includes a plurality of data processing units within the airflow duct.

18 Claims, 8 Drawing Sheets

(56) References Cited

U.S. PATENT DOCUMENTS

| | | | |
|---|---|---|---|
| 8,009,417 B2* | 8/2011 | Searby et al. | 361/679.5 |
| 8,279,601 B2* | 10/2012 | Lima | G06F 1/20 |
| | | | 361/694 |
| 8,717,763 B2* | 5/2014 | Lin | H05K 7/20563 |
| | | | 165/104.33 |
| 8,811,009 B2* | 8/2014 | Chen | H05K 7/20145 |
| | | | 165/80.1 |
| 2005/0195568 A1* | 9/2005 | Shyr | G06F 1/20 |
| | | | 361/695 |
| 2009/0323274 A1* | 12/2009 | Lin | 361/679.48 |
| 2012/0008276 A1* | 1/2012 | Cheng | G06F 1/20 |
| | | | 361/679.48 |
| 2012/0212906 A1* | 8/2012 | Chang | G06F 1/20 |
| | | | 361/695 |
| 2014/0146471 A1* | 5/2014 | Liu | H05K 7/20727 |
| | | | 361/695 |

* cited by examiner

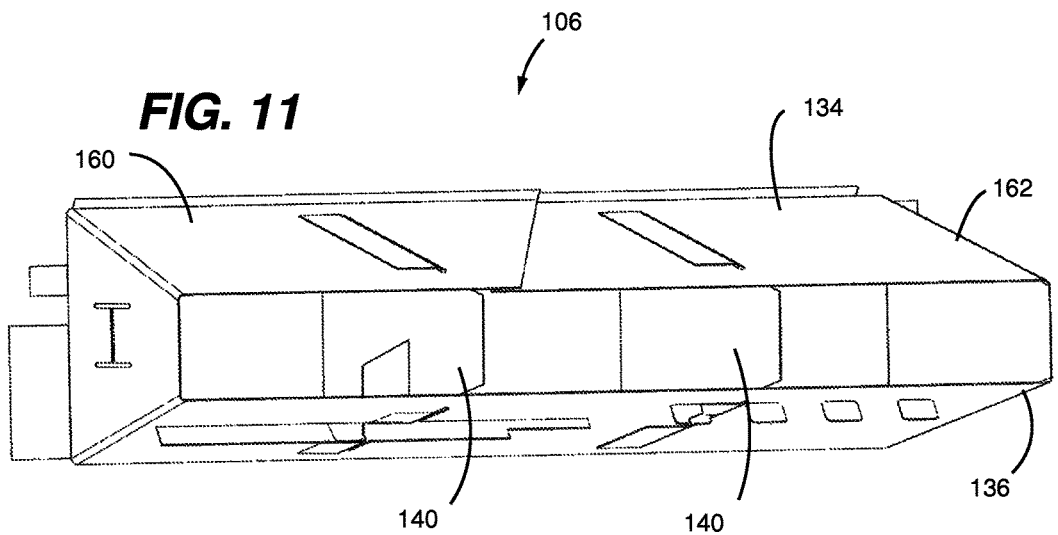
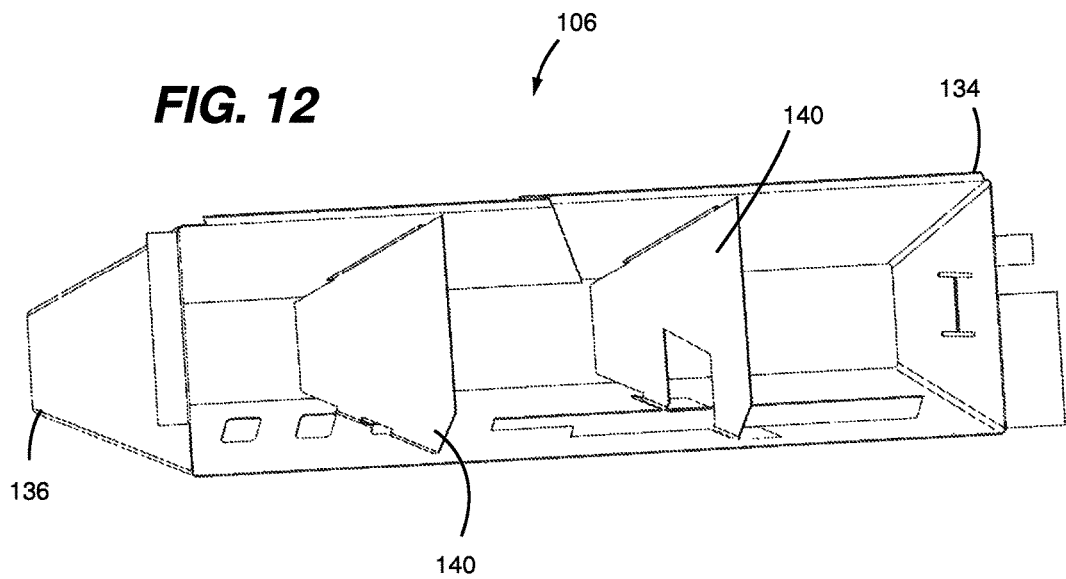

AIRFLOW DUCTING APPARATUS FOR DATA PROCESSING SYSTEMS

CROSS REFERENCE TO RELATED APPLICATIONS

This patent application claims priority from U.S. Provisional Patent Application having Ser. No. 61/716,835, filed 22 Oct. 2012, entitled "Server Card Baffle Apparatus", having a common applicant herewith and being incorporated herein in its entirety by reference.

FIELD OF THE DISCLOSURE

The disclosures made herein relate generally to cooling implements for data processing systems and, more particularly, to an airflow ducting apparatus for a data processing system.

BACKGROUND

Data processor cards such as, for example, those carrying system on a chip (SOC) units are capable of rapidly processing large volumes of data. Rapidly processing such large volumes of data results in the generation of a considerable amount of heat. This heat has several adverse effects on system performance, system design and the like. One such adverse affect is reduction in processing capacity to limit the potential of overheating. Another such adverse affect is increased operating cost due to energy required for exhausting over-heated air. Still another such adverse affect is decreased density of heat-generating devices (e.g., SOC units) within a data processing system (e.g., server) chassis due to space occupied by an increased number of cooling fans and/or fewer heat-generating devices per unit column of chassis space. Therefore, a cooling solution that limits the magnitude of adverse affects of heat generated by heat-generating devices within a data processing system chassis (i.e., enclosure) would be advantageous, desirable and useful.

SUMMARY OF THE DISCLOSURE

Embodiments of the present invention are directed to an airflow ducting apparatus for use within a data processing system enclosure (e.g., server chassis). More specifically, embodiments of the present invention are directed to an airflow ducting apparatus that includes airflow ducts that are mountable directly on data processor cards and/or system boards mounted within a data processing system chassis and that includes a cooling fan manifold structure that provides for airflow through the airflow ducts. As such, embodiments of the present invention advantageously overcome adverse affects associated with heat generation from the data processing devices mounted on the data processor cards and/or boards by providing for controlled and selective heat extraction from the data processing devices mounted thereon.

In one embodiment of the present invention, a data processing apparatus comprises a circuit substrate, a plurality of data processing units each mounted on the circuit substrate, and an airflow baffle mounted on the circuit substrate. The data processing units are spaced apart from each other along the circuit substrate. Side walls of the airflow baffle and the circuit substrate jointly define an airflow passage. The airflow baffle extends over the data processing units such that the data processing units are within the airflow passage.

In another embodiment of the present invention, a server card comprises a printed circuit board (PCB), a plurality of system on a chip (SOC) units each mounted on the PCB, one or more system resource device connectors connected to the PCB adjacent to the SOC units, and an airflow baffle mounted on the PCB. The SOC units are spaced apart from each other along a length of the PCB. Side walls of the airflow baffle and the PCB jointly define an airflow passage. The airflow baffle extends over the SOC units such that the SOC units are within the airflow passage and the one or more system resource device connectors is outside of the airflow passage.

In another embodiment of the present invention, a data processing system comprises an enclosure, one or more airflow manifold structures within the enclosure, and a plurality of data processor cards mounted within the enclosure. Each one of the one or more airflow manifold structures has an air inlet portion and an air outlet portion. Each one of the data processor cards extends substantially parallel to each other one of the data processor cards. Each one of the data processor cards includes an airflow duct having an air inlet portion thereof covering a portion of the air outlet portion of at least one of the one or more airflow manifold structures and includes a plurality of data processing units within the airflow duct.

A data processing system comprises a chassis, a system board, an airflow manifold structure and a plurality of server cards. The system board is attached to a side wall of the chassis. The system board has a first end portion adjacent to an end wall of the chassis and a second end portion opposite the end wall of the chassis. The airflow manifold structure is attached to the system board, to the chassis adjacent to the end wall of the chassis, or to both. Each one of the server cards is mounted on the system board (e.g., via being plugged into an electrical connector) with a first end portion thereof adjacent to the first end portion of the system board and a second end portion thereof adjacent to the second end portion of the system board. The airflow manifold structure has an air inlet portion and an air outlet portion. Front and rear surfaces of each one of the server cards extend substantially parallel to the front and rear surfaces of each other one of the server cards and extend substantially perpendicular to front and rear surfaces of the system board. Each one of the server cards includes a printed circuit board (PCB), a plurality of system on a chip (SOC) units each connected to the PCB, a plurality of system resource device connectors each connected to the PCB, and an airflow baffle mounted on the PCB. The SOC units are spaced apart from each other along a length of the PCB. Side walls of the airflow baffle and the PCB jointly define an airflow passage. The airflow baffle extends over the SOC units such that the SOC units are within the airflow passage and at least a portion of the system resource device connectors are outside of the airflow passage. An air inlet portion of the airflow passage covers a portion of the air outlet portion of the airflow manifold structure.

These and other objects, embodiments, advantages and/or distinctions of the present invention will become readily apparent upon further review of the following specification, associated drawings and appended claims.

BRIEF DESCRIPTION OF THE DRAWINGS

FIG. 11 is a first perspective view showing the airflow manifold structure of the data processing system shown in FIGS. 1-3;

FIG. 12 is a second perspective view of the airflow manifold structure shown in FIG. 11;

DETAILED DESCRIPTION

Figure 1:
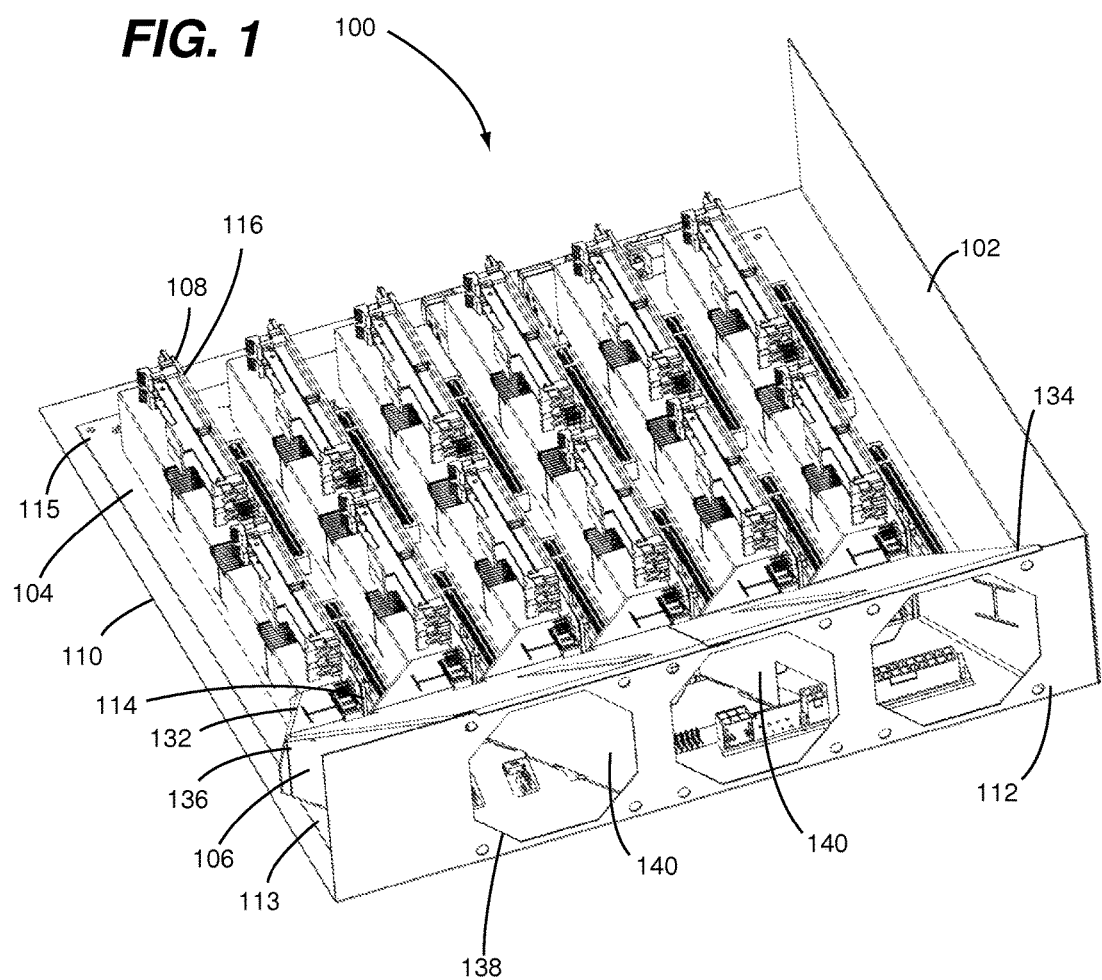
FIG. 1 is a first perspective view showing a data processing system configured in accordance with an embodiment of the present invention.
Figure 2:
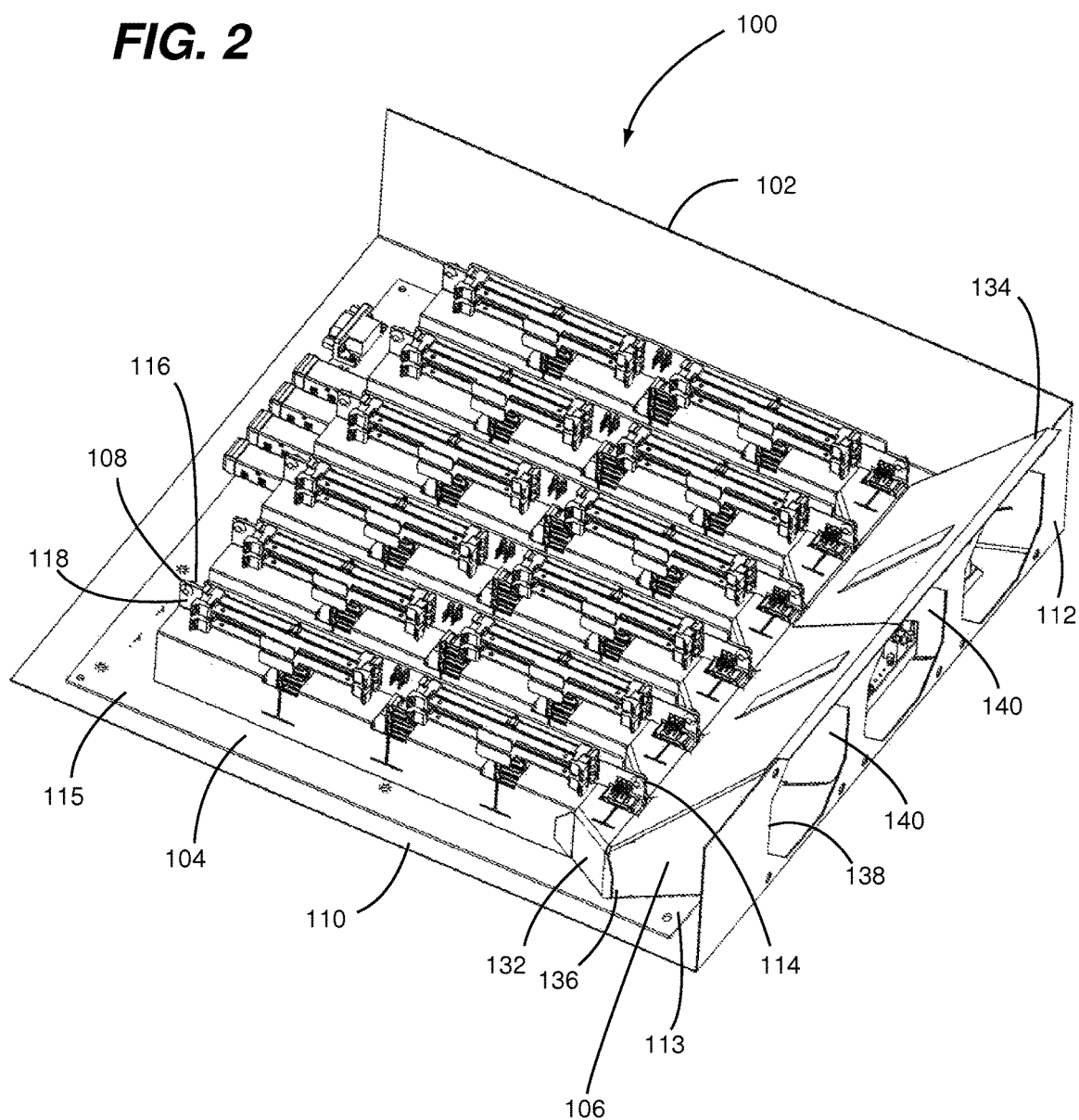
FIG. 2 is a second perspective view of the data processing system shown in FIG. 1.
Figure 3:
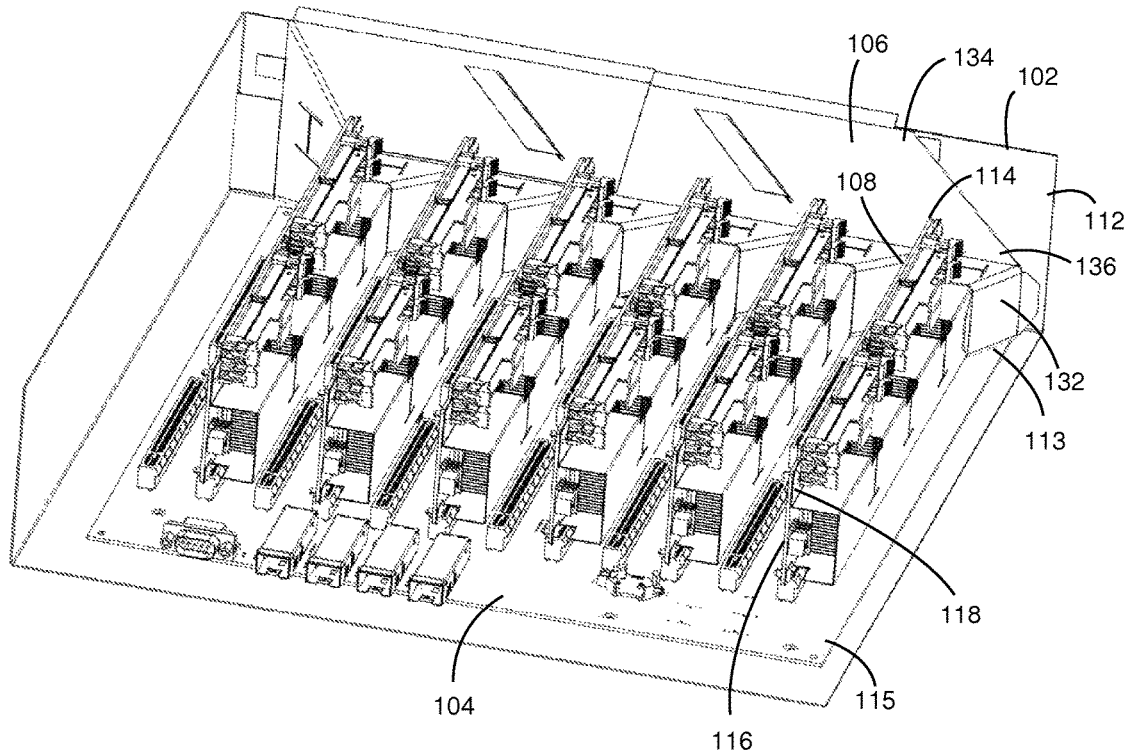
FIG. 3 is a third perspective view of the data processing system shown in FIG. 1.

FIGS. 1-3 show a data processing system 100 configured in accordance with an embodiment of the present invention. A server system is one example of the data processing system 100. However, a skilled person will appreciate that the present invention is not unnecessarily limited to any particular data processing system or data processing functionality.

The data processing system 100 comprises a chassis 102, a system board 104, an airflow manifold structure 106, and a plurality of server cards 108. The system board 104 is attached to a side wall 110 (e.g., bottom side wall) of the chassis 102. The airflow manifold structure 106 is attached to an end wall 112 of the chassis 102 and can additionally be attached to the system board 104. The system board 104 has a first end portion 113 adjacent to the end wall 112 of the chassis 102 and a second end portion 115 opposite the end wall 112 of the chassis 102 (i.e., adjacent to an end wall (not shown) that is opposite the end wall 112). Each one of the server cards 108 is mounted on the system board 104 with a first end portion 114 thereof adjacent to the first end portion 113 of the system board 104 and a second end portion 116 thereof adjacent to the second end portion 115 of the system board 104. Each one of the server cards 108 has opposing major surfaces (i.e., front and rear surfaces) that extend substantially parallel to the opposing major surfaces of each of the other server cards 108 and that extend substantially perpendicular to opposing major surfaces (i.e., front and rear surfaces) of the system board 104.

Figure 4:
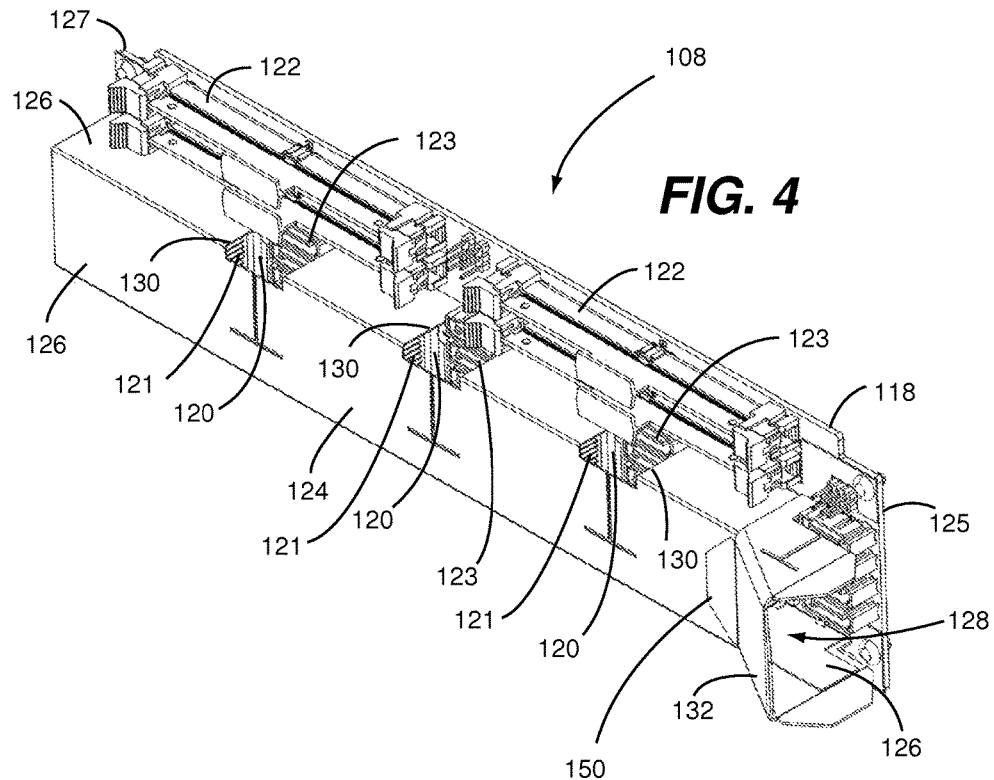
FIG. 4 is a first perspective view showing a server card of the data processing system shown in FIG. 1.
Figure 5:
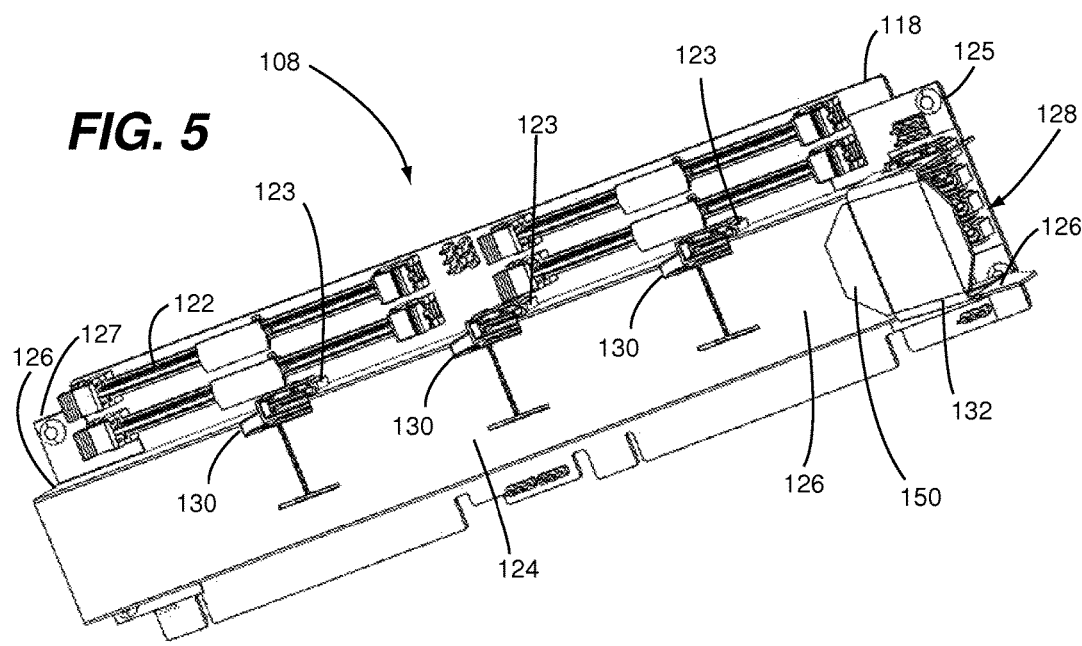
FIG. 5 is a second perspective view of the server card shown in FIG. 4.
Figure 6:
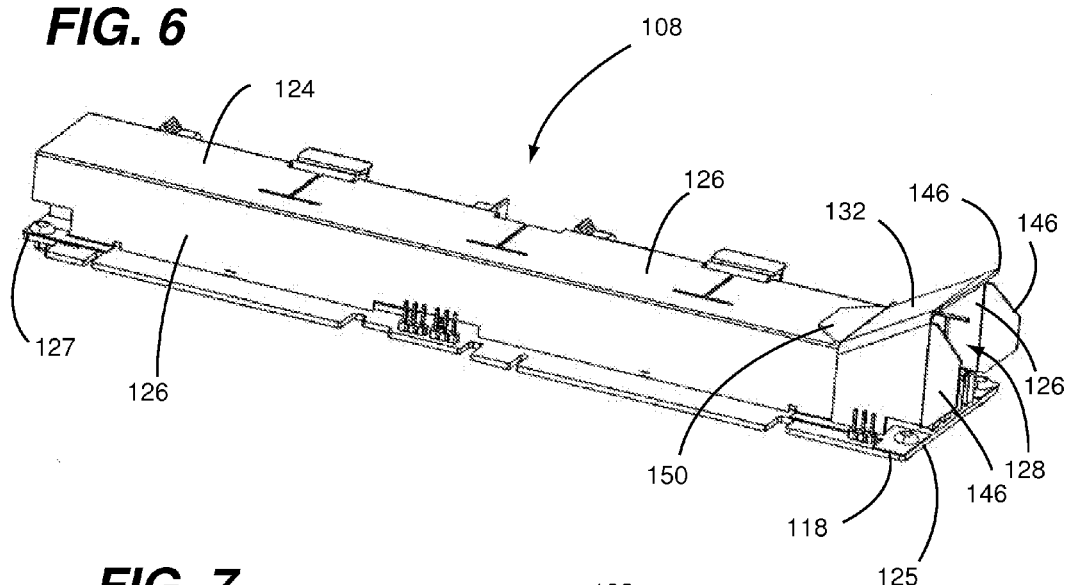
FIG. 6 is a third perspective view of the server card shown in FIG. 4.
Figure 7:
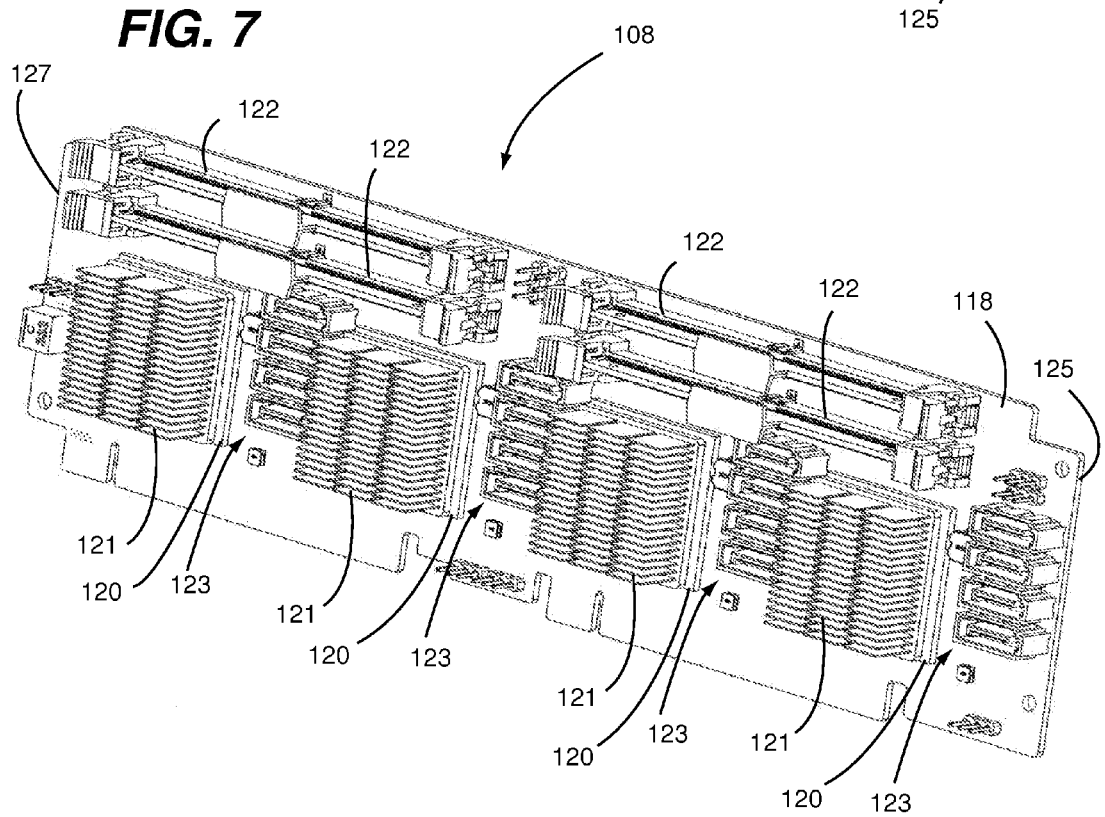
FIG. 7 is a perspective view of the server card shown in FIGS. 4-6 with an airflow baffle thereof removed.

Referring now to FIGS. 4-6, each one of the server cards 108 includes a printed circuit board (PCB) 118, a plurality of system on a chip (SOC) units 120, a plurality of system resource device connectors 122, a plurality of cable connectors 123 and an airflow baffle 124. Each one of the SOC units 120 (i.e., a data processing unit with one or more data processing chips) is connected to the PCB 118. The SOC units 120 are spaced apart from each other along a length of the PCB 118. Each one of the SOC units 120 includes a heat dissipating structure 121 (e.g., a heat sink). Each one of the system resource device connectors 122 and cable connectors 123 is connected to the PCB 118. One example of the system resource device connectors 122 is connectors for memory such as dual in-line memory modules (DIMMs). For clarity, FIG. 7 is provided for showing an embodiment of a component layout of each server card 108 with the airflow baffle 124 removed.

Each one of the SOC units 120 includes a heat dissipating structure 121. A heat sink with exposed fins is an example of the heat dissipating structure 121. The heat dissipating structure 121 serves the purpose of enhancing extraction of heat from the respective SOC unit.

Still referring now to FIGS. 4-6, it can be seen that the airflow baffle 124 is mounted on the PCB 118. Side walls 126 of the airflow baffle and the PCB 118 jointly define an airflow passage 128. The airflow baffle 124 extends over the SOC units 120 such that the SOC units 120 are within the airflow passage 128 and the system resource device connectors 122 are outside of the airflow passage 128. In other embodiments, all or a portion of the system resource device connectors 122 can be inside the airflow passage 128. At least a portion of the cable connectors 123 are mounted on the PCB 118 at a position at least partially within the airflow passage 128. Each one of the cable connectors 123 has an associated cable connector access opening 130 adjacent thereto that extends through one or more of the sidewalls 126 of the airflow baffle 124. It is disclosed herein that the cable connector access opening 130 also serves as an air release opening for allowing air to escape from within the airflow passage 128 and provide for airflow through a main cavity of the chassis 102. Similarly, other openings not associated with a cable connector can be provided in one or more sidewalls 126 of the airflow baffle to enable air to be released from within the airflow baffle 124 at a location between an airflow inlet of the airflow passage 128 and an airflow outlet of the airflow passage 128.

As best shown in FIGS. 4-6, the airflow baffle 124 includes an air inlet body 132 through which the airflow passage 128 extends. As best shown in FIGS. 1-3, the airflow manifold structure 106 has an air inlet portion 134 and an air outlet portion 136. The air inlet portion 134 of the airflow manifold structure 106 extends over a plurality of fan openings 138 within the end wall 112 of the chassis 102. The air inlet body 132 of the airflow baffle 124 of each one of the server cards 108 extends over a portion of the air outlet portion 136 of the airflow manifold structure 106. The airflow manifold structure 106 can include one or more manifold partitions 140 that are each positioned between two adjacent fan openings 138 and that extend partially or fully between the air inlet portion 134 and the air outlet portion 136 of the airflow manifold structure 106. This combined airflow baffle and air manifold arrangement (i.e., airflow ducting apparatus) allows for airflow generated by fans (not shown) mounted over each one of the covering the fan openings 138 to be provided into the airflow manifold structure 106 and through the airflow passage 128 of each one of the server cards 108.

A skilled person will appreciate that heat transfer from the heat dissipating structure 121 of the SOC units will cause a thermal gradient within the air of the airflow along a length of the airflow baffle 124. This thermal gradient results from heating of the air as it successively passes across the heat dissipating structures 121 of SOC units 120 along the length of the air passage 128. To maintain efficiency of heat extraction, it is disclosed herein that the configuration of the heat dissipating structure 121 of a particular one of the SOC units 120 can have a heat dissipating capability substantially less than that of the heat dissipating structure 121 of a succeeding one of the SOC units 120 along the length of the airflow baffle 124. In this regard, the configuration of the heat dissipating structure 121 of the SOC unit 120 closest to an air inlet of the airflow passage 128 (e.g., adjacent to a first end portion 125 of the PCB 118) can have a heat dissipating capability substantially less than that of the heat dissipating structure 121 of the SOC unit 120 closest to an airflow outlet of the airflow passage 128 (e.g., adjacent to a second end portion 127 of the PCB 118).

To compensate for the above-mentioned thermal gradient, it is further disclosed herein that a shape of the airflow passage 128 can be configured to manipulate airflow speed along the length of the airflow passage 128. More specifically, the sidewalls 126 of the airflow baffle 124 can be shaped in such a way as to cause the speed of air flowing through the airflow passage 128 to increase along the length of the airflow baffle 124 and thereby increasing the effectiveness of a particular one of the heat dissipating structures 121 relative to a preceding one of the heat dissipating structures 121. For example, the airflow baffle 124 can be configured such that a cross-sectional area of the airflow passage 128 at a particular one of the SOC units 120 is substantially greater than a cross sectional area of the airflow passage 128 at a succeeding one of the SOC units 120 along the length of the airflow baffle 124. An air diverter/volume filler within the airflow passage 128 can be used for providing similar graduate and/or tuned air speed functionality.

Figure 8:
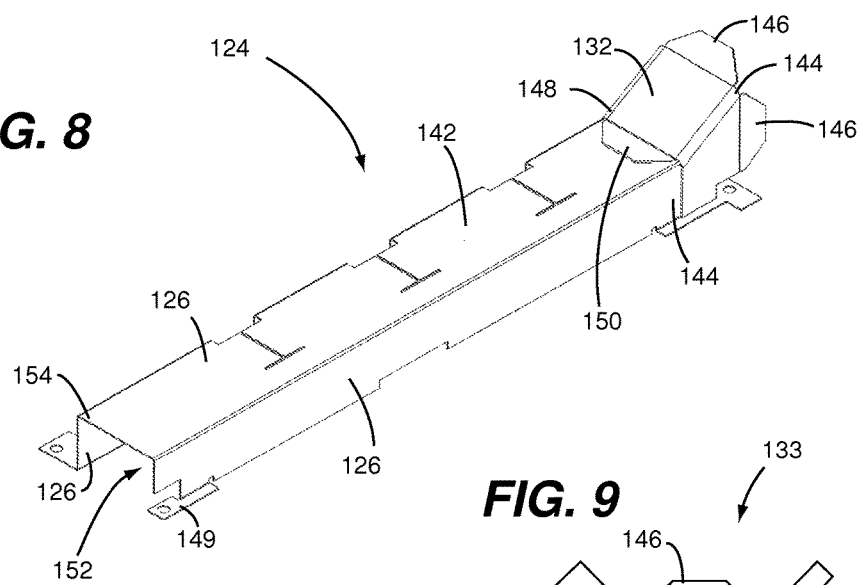
FIG. 8 is a perspective view showing the airflow baffle of the server card shown in FIGS. 4-6

As shown in FIG. 8, the airflow baffle 124 can be of a multi-part construction. For example, as shown, the air inlet body 132 is a first discrete part of the airflow baffle 124 and a main air channel body 142 is a second discrete part of the airflow baffle 124. A first end portion 144 of the air inlet body 132 is configured for interfacing with the air outlet portion 136 of the airflow manifold structure 106. For example, the first end portion 144 of the air inlet body 132 includes flaps 146 for overlapping a mating portion of the airflow manifold structure 106. A second end portion 148 of the air inlet body 132 is mounted on a first end portion 144 of the main air channel body 142. The second end portion of the air inlet body 132 includes a flap 150 that engages a mating portion of the main air channel body 142. Accordingly, the air inlet body 132 and the main air channel body 142 jointly define a channel 152 that extends between the first end portion 144 of the air inlet body 132 (i.e., air inlet end) and a second end portion 154 of the main air channel body 142. As best shown in FIG. 1, it is disclosed herein that a configuration of the air inlet body 132 (e.g., taper between first and second end portions thereof) can be different for one airflow baffle than another such as for accommodating use on server cards that are located at various slot portions within a chassis (e.g., air inlet body for slot 0 having a different taper than that for slots 1-5).

Figure 9:
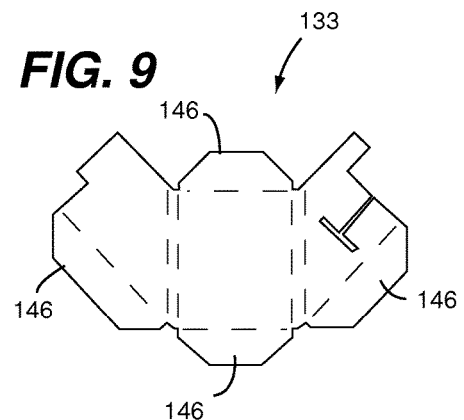
FIG. 9 is a plan view showing an embodiment of a piece of sheet material from which an air inlet body of the airflow baffle of FIG. 8 can be formed.
Figure 10:
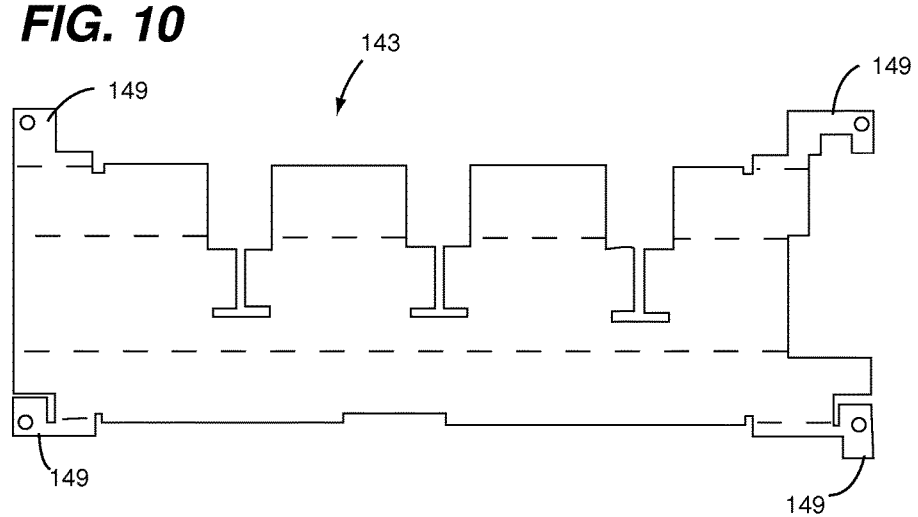
FIG. 10 is a plan view showing an embodiment of a piece of sheet material from which an main body of the airflow baffle of FIG. 8 can be formed.

FIG. 9 shows an embodiment of a piece of sheet material 133 from which the air inlet body 132 can be formed and FIG. 10 shows an embodiment of a piece of sheet material 143 from which the main air channel body 142 can be formed. These pieces of material 133, 143 have a shape (e.g., a die cut shape) allowing it to be folded (e.g., along score lines) into the respective one of the parts 132, 142 of the airflow baffle 124. One example of a suitable material is FORMEX brand sheet material that is commercially available from ITW (Illinois Tool Works) Incorporated. A pressure sensitive (i.e., peel and stick) adhesive, such as that commercially available from 3M Company under the part no. 9832, can be applied to a surface of the sheet material. For example, the pressure-sensitive adhesive can be provided on one or more flaps 146 of the piece of sheet material 133 and on one or more tabs 149 of the piece of sheet material 143 for enabling the air inlet body 132 to be secured to the main air channel body 142, for enabling the air inlet body 132 to be secured to the airflow manifold structure 106, and for enabling the main air channel body 142 to the PCB 118. The tabs 149 of the piece of sheet material 143 can be shaped (i.e., configured) to accommodate (e.g., follow the footprint of) adjacent components that are mounted on the PCB 118.

As shown in FIGS. 11 and 12, the airflow manifold structure 106 can be of a multi-part construction. For example, as shown, a main body 160 is one discrete part of the airflow manifold structure 106 and the manifold partitions 140 are each additional discrete parts of the airflow manifold structure 106. As disclosed above in reference to FIGS. 1-3, the air inlet portion 134 of the airflow manifold structure 106 is configured to extend over a plurality of fan openings 138 within the end wall 112 of the chassis 102 and the manifold partitions 140 are configured to limit interaction of airflow generated by adjacent fans.

Figure 13:
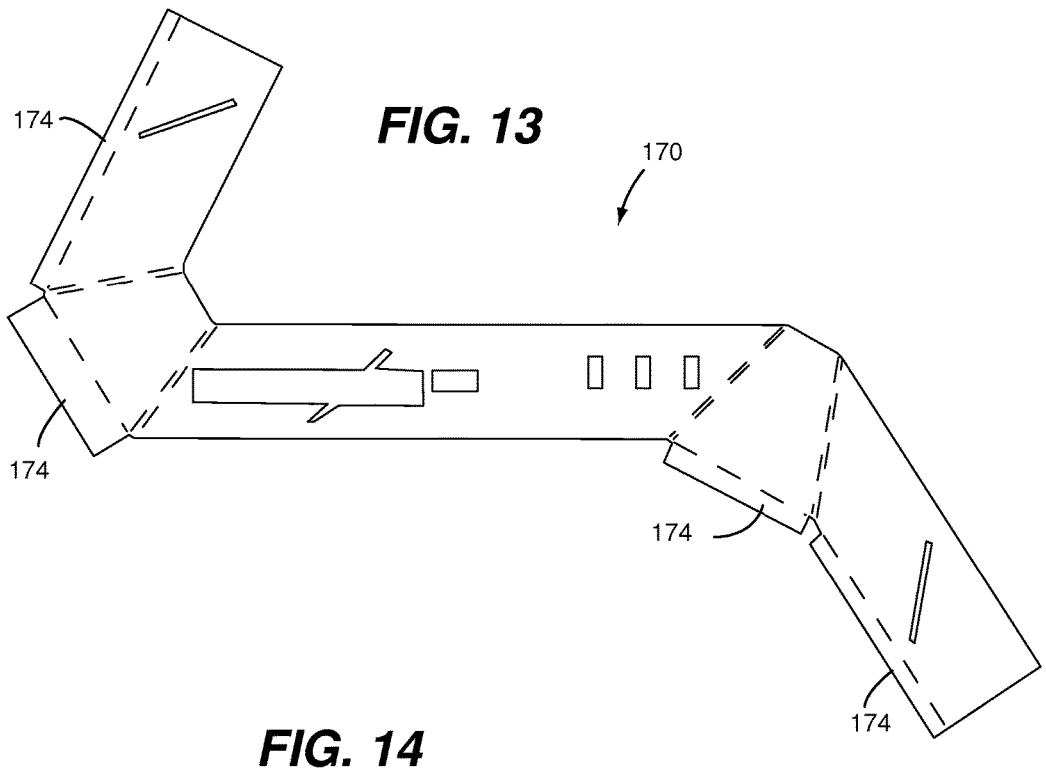
FIG. 13 is a plan view showing an embodiment of a piece of sheet material from which a main body of the airflow manifold structure of FIGS. 11 and 12 can be formed.
Figure 14:
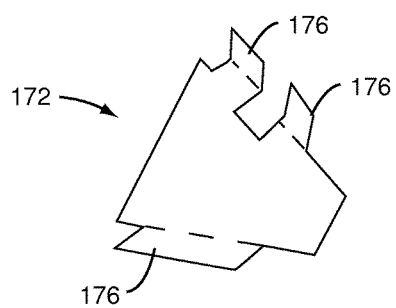
FIG. 14 is a plan view showing an embodiment of a piece of sheet material from which a manifold partition of the airflow manifold structure of FIGS. 11 and 12 can be formed.

FIG. 13 shows an embodiment of a piece of sheet material 170 from which the main body 160 of the airflow manifold structure 106 can be formed and FIG. 14 shows an embodiment of a piece of material 172 from which the manifold partition 140 can be formed. These pieces of material 170, 172 can be folded (e.g., along score lines) into the respective one of the parts 140, 160 of the airflow manifold structure 106. FORMEX brand sheet material, which has been discussed above in reference to FIGS. 9 and 10, is a suitable material from which the various pieces of the airflow manifold structure 106 can be formed. A pressure sensitive, which has been discussed above in reference to FIGS. 9 and 10, can be provided on one or more flaps 174 of the piece of sheet material 170 for enabling the main body 160 of the airflow manifold structure 106 to be secured to the chassis 102 and on one or more flaps 176 of the piece of sheet material 172 for enabling the manifold partition 140 to be secured to the main body 160 of the airflow manifold structure 106.

In view of the disclosures made herein, a skilled person will appreciate that an airflow ducting apparatus configured in accordance with an embodiment of the present invention can contribute to reducing or eliminating adverse thermal considerations such as, for example, localized 'hot spots' on a server card (i.e., a data processing card). More specifically, a data processing system having multiple SOC units on each server card and having multiple server cards on a system board often exhibits problems arising from overheating of discrete components (e.g., SOC units) and/or non-uniform heat of one or more of the server cards. Advantageously, an airflow ducting apparatus configured in accordance with an embodiment of the present invention can aid in maintaining more uniform and consistent cooling characteristics across the SOC units, which contributes to enabling all of the server cards and SOC units thereof to maintain preferred power consumption, data processing performance and component reliability.

Although specific materials for and means of constructing the airflow manifold structure 106 and the airflow baffle 124 are presented herein, embodiments of the present invention are not limited to any particular material for or means of constructing the airflow manifold structure 106 or the airflow baffle 124. For example, the airflow baffle 124 and/or the airflow manifold structure 106 can each be made from one or more pieces that are formed by injection molding a plastic material. Similarly, embodiments of the present invention are not limited to any particular means for securing the airflow manifold structure 106 to the chassis 102 and/or securing the airflow baffle 124 to the PCB 118. For example, it is disclosed herein that the airflow baffle 124 can be mechanically secured to the PCB 118 by engaging mounting tabs of the airflow baffle 124 with mating features (e.g., slots and/or channels) of the PCB 118.

Although the invention has been described with reference to several exemplary embodiments, it is understood that the words that have been used are words of description and illustration, rather than words of limitation. Changes may be made within the purview of the appended claims, as presently stated and as amended, without departing from the scope and spirit of the invention in all its aspects. Although the invention has been described with reference to particular means, materials and embodiments, the invention is not intended to be limited to the particulars disclosed; rather, the invention extends to all functionally equivalent technologies, structures, methods and uses such as are within the scope of the appended claims.

What is claimed is:

1. A data processing apparatus, comprising:
   a circuit substrate;
   a plurality of data processing units each mounted on the circuit substrate, wherein the data processing units are spaced apart from each other along the circuit substrate; and
   an airflow baffle mounted on the circuit substrate, wherein side walls of the airflow baffle and the circuit substrate jointly define an airflow passage, wherein the airflow baffle extends over the plurality of data processing units such that the plurality of data processing units are within the airflow passage, and wherein the heat dissipating structure of the data processing unit closest to an airflow inlet of the airflow passage has a heat dissipating capability less than that of the heat dissipating structure of the data processing unit closest to an airflow outlet of the airflow passage.

2. The data processing apparatus of claim 1, further comprising:
   a cable connector mounted on the circuit substrate at a position at least partially within the airflow passage, wherein a cable connector access opening extends through at least one of the sidewalls of the airflow baffle.

3. The data processing apparatus of claim 2, wherein the cable connector is exposed within the cable connector access opening.

4. The data processing apparatus of claim 1, wherein a cross-sectional area of the airflow passage at a first one of the plurality of data processing units is greater than a cross-sectional area of the airflow passage at a second one of the plurality of data processing units.

5. The data processing apparatus of claim 1, wherein each one of the plurality of data processing units includes a data processing chip.

6. The data processing apparatus of claim 1, wherein an air release opening is provided in a sidewall of the airflow baffle at a location between an airflow inlet of the airflow passage and an airflow outlet of the airflow passage.

7. The data processing apparatus of claim 6, wherein a cross-sectional area of the airflow passage at a first one of the plurality of data processing units is greater than a cross-sectional area of the airflow passage at a second one of the data processing units.

8. A server card, comprising:
   a printed circuit board (PCB);
   a plurality of system on a chip (SOC) units each mounted on the PCB, wherein the SOC units are spaced apart from each other along a length of the PCB, and wherein each SOC unit has a heat dissipating structure mounted thereon;
   a system resource device connector connected to the PCB adjacent to the SOC units; and
   an airflow baffle mounted on the PCB, wherein side walls of the airflow baffle and the PCB jointly define an airflow passage, wherein the airflow baffle extends over the plurality of SOC units such that the plurality of SOC units are within the airflow passage and the system resource device connector is outside of the airflow passage, and wherein the heat dissipating structure of the SOC unit closest to an airflow inlet of the airflow passage has a heat dissipating capability less than that of the heat dissipating structure of the SOC unit closest to an airflow outlet of the airflow passage.

9. The server card of claim 8, further comprising:
   a cable connector mounted on the PCB at a position at least partially within the airflow passage, wherein a cable connector access opening extends through at least one of the sidewalls of the airflow baffle.

10. The server card of claim 9, wherein the cable connector is exposed within the cable connector access opening.

11. The server card of claim 8, wherein a cross-sectional area of the airflow passage at a first one of the plurality of SOC units is greater than a cross-sectional area of the airflow passage at a second one of the plurality of SOC units.

12. The server card of claim 8, wherein an air release opening is provided in a sidewall of the airflow baffle at a location between an airflow inlet of the airflow passage and an airflow outlet of the airflow passage.

13. The server card of claim 12, wherein a cross-sectional area of the airflow passage at a first one of the plurality of SOC units is greater than a cross-sectional area of the airflow passage at a second one of the plurality of SOC units.

14. A data processing system, comprising:
   an enclosure;
   one or more airflow manifold structures within the enclosure, wherein each one of the one or more airflow manifold structures has an air inlet portion and an air outlet portion; and
   a plurality of data processor cards mounted within the enclosure, wherein each one of the data processor cards extends substantially parallel to each other, and wherein each one of the data processor cards includes:
     an airflow duct having an air inlet portion thereof covering a portion of the air outlet portion of at least one of the one or more airflow manifold structures; and
     a heat dissipating structure, wherein the heat dissipating structure of the data processor card closest to the air inlet portion of the one or more airflow manifold structures has a heat dissipating capability less than that of the heat dissipating structure of the data processor card closest to the air outlet portion of the one or more airflow manifold structures.

15. The data processing system of claim 14, wherein the one or more airflow manifold structures form at least a portion of an airflow passage, and wherein a cross-sectional area of the airflow passage at a first one of the plurality of data processor cards is greater than a cross-sectional area of the airflow passage at a second one of the plurality of data processor cards.

16. A data processing system, comprising:
a chassis;
a system board attached to a side wall of the chassis, wherein the system board has a first end portion adjacent to an end wall of the chassis and a second end portion opposite the end wall of the chassis;
an airflow manifold structure attached to at least one of the system board and the chassis adjacent to the end wall of the chassis, wherein the airflow manifold structure has an air inlet portion and an air outlet portion; and
a plurality of server cards each mounted on the system board with a first end portion thereof adjacent to the first end portion of the system board and a second end portion thereof adjacent to the second end portion of the system board, wherein each one of the plurality of server cards includes:
a printed circuit board (PCB);
a plurality of system on a chip (SOC) units each connected to the PCB, wherein the SOC units are spaced apart from each other along a length of the PCB, and wherein each of the SOC units has a heat dissipating structure mounted thereon;
a plurality of system resource device connectors each connected to the PCB; and
an airflow baffle mounted on the PCB, wherein side walls of the airflow baffle and the PCB jointly define an airflow passage, wherein the airflow baffle extends over the plurality of SOC units such that the plurality of SOC units are within the airflow passage and at least a portion of the plurality of system resource device connectors are outside of the airflow passage, and wherein the heat dissipating structure of the SOC unit closest to an airflow inlet of the airflow passage has a heat dissipating capability less than that of the heat dissipating structure of the SOC unit closest to an airflow outlet of the airflow passage.

17. The data processing system of claim 16, further comprising:
a cable connector mounted on the PCB at a position at least partially within the airflow passage, wherein a cable connector access opening extends through at least one of the sidewalls of the airflow baffle.

18. The data processing system of claim 16, wherein a cross-sectional area of the airflow passage at a first one of the plurality of SOC units is greater than a cross-sectional area of the airflow passage at a second one of the plurality of SOC units.

* * * * *